(12) United States Patent
Slaby et al.

(10) Patent No.: US 10,143,111 B2
(45) Date of Patent: Nov. 27, 2018

(54) ADJUSTMENT OF A PUMP SPEED BASED ON A VALVE POSITION

(71) Applicant: Hewlett Packard Enterprise Development LP, Houston, TX (US)

(72) Inventors: Matthew Slaby, Houston, TX (US); Tuong Q Tran, Houston, TX (US); Aaron Michael Childers, Houston, TX (US); Tahir Cader, Spokane, WA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/476,937

(22) Filed: Mar. 31, 2017

(65) Prior Publication Data

US 2018/0283370 A1    Oct. 4, 2018

(51) Int. Cl.
*H05K 7/20* (2006.01)
*F04B 49/20* (2006.01)
*F04B 51/00* (2006.01)

(52) U.S. Cl.
CPC ........... *H05K 7/2079* (2013.01); *F04B 49/20* (2013.01); *F04B 51/00* (2013.01); *H05K 7/20272* (2013.01); *H05K 7/20281* (2013.01); *H05K 7/20836* (2013.01)

(58) Field of Classification Search
CPC .......... H05K 7/20218; H05K 7/20254; H05K 7/20263; H05K 7/20272; H05K 7/20281; H05K 7/20636; H05K 7/20645; H05K 7/207; H05K 7/20772; H05K 7/20781; H05K 7/20836
See application file for complete search history.

(56) References Cited

U.S. PATENT DOCUMENTS

| | | | |
|---|---|---|---|
| 7,086,247 B2 * | 8/2006 | Campbell | F28D 20/021 165/104.33 |
| 7,950,244 B2 * | 5/2011 | Iyengar | H05K 7/20781 165/80.4 |
| 7,963,119 B2 * | 6/2011 | Campbell | G06F 1/20 165/104.33 |
| 8,797,740 B2 | 8/2014 | Campbell et al. | |
| 8,817,474 B2 * | 8/2014 | Campbell | H05K 7/20709 361/689 |
| 8,925,333 B2 * | 1/2015 | Campbell | B21D 53/02 62/259.2 |
| 9,095,889 B2 * | 8/2015 | Campbell | B21D 53/02 |
| 9,148,982 B2 * | 9/2015 | Campbell | H05K 7/2079 |
| 9,148,983 B2 * | 9/2015 | Campbell | H05K 7/2079 |
| 9,295,181 B2 * | 3/2016 | Campbell | H05K 7/20281 |

(Continued)

OTHER PUBLICATIONS

Extended European Search Report, EP Application No. 18164200.0, dated Aug. 1, 2018, pp. 1-8, EPO.

*Primary Examiner* — Robert J Hoffberg
(74) *Attorney, Agent, or Firm* — Hewlett Packard Enterprise Patent Department

(57) ABSTRACT

Examples herein disclose a coolant distribution unit (CDU) including a valve, a pump, and a controller. The valve controls a coolant through the CDU and the pump maintains a differential pressure of coolant to data center components. The controller exclusively controls the CDU to determine a position of the valve. In the response to the determined position of the valve, the CDU adjusts a speed of the pump.

20 Claims, 5 Drawing Sheets

(56) References Cited

U.S. PATENT DOCUMENTS

| | | | |
|---|---|---|---|
| 2012/0279684 A1* | 11/2012 | Keisling | G06F 1/20 165/80.2 |
| 2015/0354851 A1* | 12/2015 | Yoshii | H05K 7/2079 62/179 |
| 2016/0298883 A1 | 10/2016 | Louvar et al. | |
| 2016/0345466 A1* | 11/2016 | Arvelo | H05K 7/20272 |
| 2017/0374761 A1* | 12/2017 | Zimmerman, Sr. | H05K 7/20281 |

* cited by examiner

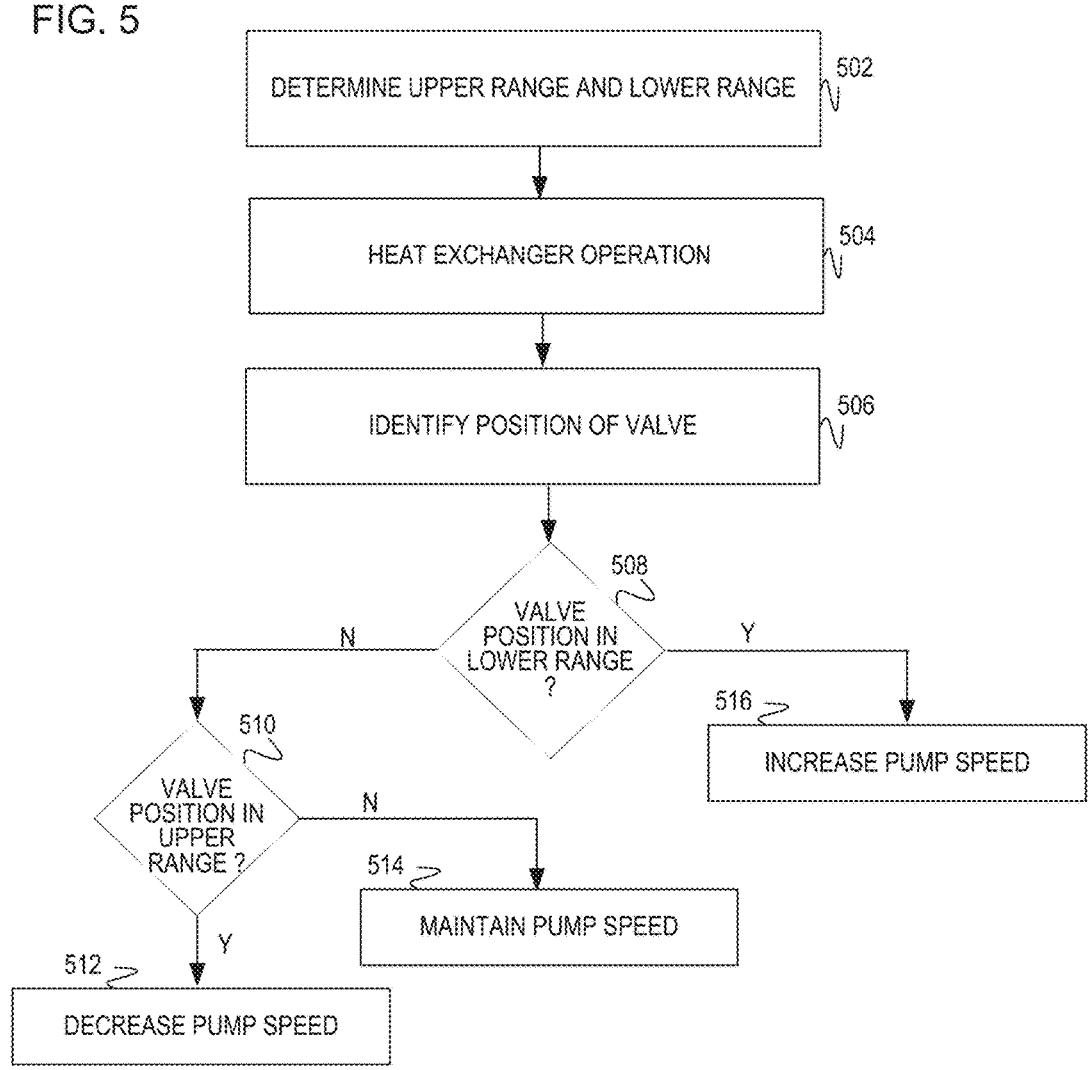

ADJUSTMENT OF A PUMP SPEED BASED ON A VALVE POSITION

BACKGROUND

In a data center, computer cooling circulates coolant to remove waste heat produced by the electronic components, thus keeping the components within permissible operating temperature limits.

BRIEF DESCRIPTION OF THE DRAWINGS

In the accompanying drawings, like numerals refer to like components or blocks. The following detailed description references the drawings, wherein:

FIG. 5 illustrates an example flowchart executable by a CDU to determine an upper range of valve positions and lower range of valve positions and adjust a pump speed in response to a valve position location either in the upper range or lower range of valve positions in accordance with the present disclosure.

DETAILED DESCRIPTION

Figure 1:
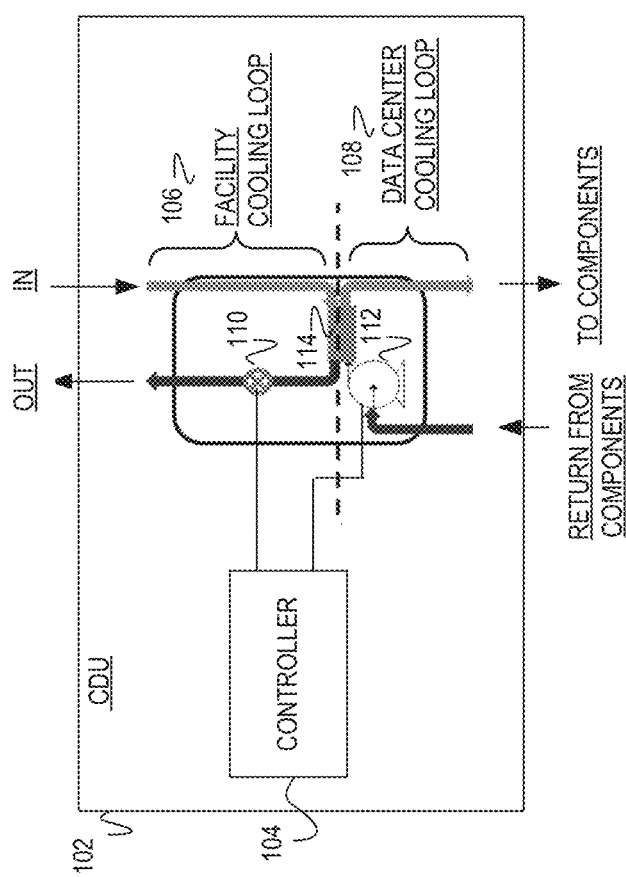
FIG. 1 illustrates an example coolant distribution unit (CDU) to identify a valve position and in turn adjust a pump speed in accordance with the present disclosure.

As global demand for data exchange grows so does the demand placed on a server. As such, servers consume exponentially more power thus producing more heat. As servers generate more heat, efficiently cooling the electrical components within a data center has become a concern. Several approaches have been implemented to provide cooling advances. Such approaches may utilize multiple coolant distribution units (CDUs) that provide a controlled fluid cooling loop to cool the components within the data center. The CDUs use an engine to effectively pump the cooling fluid to the data center components. For one such approach, one CDU broadcasts its operable torque to the other CDUs in the cooling system. The other CDUs adjust the engine torque to match the torque of the initial CDU. However this approach comes with limitations. For example, the communication among the CDUs may be fickle as the CDU addresses may be incorrect. Additionally, separate wires would connect the CDU controllers together for communication which creates reliability issues when one of the CDU controllers experiences failure. Further, this approach does not consider when some data center components may be operating at a much higher thermal point.

In another cooling system approach, multiple CDUs may operate in master and slave mode. This approach causes inefficiency issues to effectively cool the data center components. This approach relies on the use of a dedicated common communications network (e.g., common supply and return lines). The use of the common fluid network means that if one of the CDUs is serviced, the overall network is affected. Additionally, much manual labor and time is needed at the customer site to set-up the common fluid network. During set-up, each CDU is in operation and synched up to the overall network. Further, this approach leads to reliability issues when one of the CDUs experiences failure.

To address these issues, the present disclosure provides a means to efficiently cool a data center. Some of the examples comprise multiple CDUs that operate independently of one another to balance the cooling load in the data center. For example, each CDU adjusts a pump speed controlled exclusively by a valve position. Operating each CDU independent of one another prevents the aforementioned communication issues between the CDU controllers. Additionally, independent CDU operation prevents overload for a given CDU and allows the other CDUs to take over in the case of a failed CDU. In this manner, each CDU performs a self-regulation that balances the overall cooling system.

In another example, determining if the valve position is more open than closed indicates the particular CDU among the multiple CDUs is experiencing a higher cooling load. In turn, the CDU decreases the pump speed which decreases the coolant flow to the data center components. As such, the other CDUs in the cooling system determine their respective valve positions and increase the respective pump speed to increase the coolant flow to the data center components. In this manner, each CDU operates to balance an overall cooling load to the data center without communication amongst themselves. Balancing the cooling load to the data center without communication between the CDUs removes the challenges and issues for installing multiple CDUs. Additionally, operating each CDU independently provides a flexible and easily serviceable CDU.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

The foregoing disclosure describes a number of example implementations for adjusting a pump speed based on a determined valve position. The disclosed examples may include systems, devices, computer-readable storage media, and methods for detecting the coolant leak. For purposes of explanation, certain examples are described with reference to the components illustrated in FIGS. 1-3. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples.

FIG. 1 illustrates an example CDU 102 including controller 104 to determine a position of valve 110 and in response to the position of valve 110, adjusting a speed of pump 112. Valve 110 is coupled to facility cooling loop 106 which controls coolant through CDU 102. For example, valve 110 controls an amount of coolant flow from CDU 102 to a chiller (not illustrated) as indicated with "out" and returns the chilled coolant on "in" to heat exchanger 114. Heat exchanger 114 transfers heat from the coolant on data center cooling loop 108. As used herein, "data center cooling loop" refers to, in one example, coolant circulating between the pump and given components (e.g., IT racks) to be cooled, while "facility cooling loop" refers to cooled/conditioned coolant circulating between a chiller external to the CDU and the heat exchanger to regulate the temperature of the data center coolant. The term, "coolant" as used herein refers to fluid that absorbs heat from the heated data center components.

The system in FIG. 1 represents CDU 102 for operation in a data center to cool the data center components. Although FIG. 1 illustrates CDU 102 as including controller 104, valve 110, pump 112, and heat exchanger 114 to cool the data center, implementations should not be limited as this was done for illustration purposes. For example, the cooling system may use additional CDUs and components not illustrated which operate to cool the overall data center. In implementations, the cooling system includes multiple CDUs to balance the cooling load to the data center components. In this implementation, each CDU operates independently of the other CDUs to each measure valve position which indicates the cooling load experienced by the respective CDU. Based on the valve position indicating a higher or lower load, the respective controller for each CDU adjusts the respective pump speed to either increase or decrease the coolant flow to the data center components. This implementation allows the CDUs to increase contribution to the data center cooling, when one of the CDUs is experiencing a higher load and decreases the amount of coolant flow to the data center components. This implementation is explained in detail in later figures.

CDU 102 is a coolant distribution unit that provides a controlled flow of coolant to cool the heated data center components. CDU 102 includes controller 104 to identify the position of valve 110 which indicates whether the CDU is experiencing the higher cooling load or lower cooling load. For example, assume valve 110 is 10% open, this indicates a lower cooling load than if the valve is 90% open which indicates a higher cooling load. The cooling load amount is represented by how much coolant flows through facility loop 106 to heat exchanger 114. The more coolant flow going through facility cooling loop 106 indicates more heat should be transferred at heat exchanger 114 from the coolant on data center cooling loop 108. In response to the position of valve 110, controller 104 adjusts the speed of pump 112 to increase or decrease, accordingly.

Controller 104 exclusively controls CDU 102 thus operating CDU 102 independently without communication or interaction from other controllers or other CDUs. Allowing controller 104 to exclusively operate CDU 102 allows multiple CDUs to operate independently of one another while also balancing the cooling load to the data center. Controller 104 determines the position of valve 110 and in turn, adjusts the speed of pump 112. The adjustment of the pump speed as an increase or decrease is based on the position of valve 110. Increasing or decreasing the pump speed also causes an increase or decrease of the amount of coolant flowing to the data center components, accordingly. Increasing or decreasing the amount of coolant flowing causes a pressure drop or pressure increase and thus a change in the differential pressure. In other words, the increase in pump speed would increase the flow of coolant through to the data center components. Increasing the flow of coolant increases the pressure and thus the differential pressure. Alternatively, the decrease in the pump speed decreases the flow of coolant causing a pressure drop and decrease of differential pressure. Controller 104 may include, by way of example, an integrated circuit, semiconductor, memory module, central processing unit (CPU), processing resource, application-specific integrated circuit (ASIC), controller, processor, chipset, or other type of hardware component.

Facility cooling loop 106 and data center cooling loop 108 operate in conjunction via controller 104 to balance the data center cooling system. For example, facility cooling loop 106 operates by removing heated coolant to the chiller and returning to heat exchanger 114 to transfer the heat from the data center cooling loop 108. Thus, the more open position of valve 110 indicates the higher cooling load (e.g., greater amount of coolant flow) used to cool data center cooling loop 108.

Valve 110, coupled to facility cooling loop 106, controls the coolant through the CDU. As such, valve 110 allows a flow of coolant on the facility cooling loop 106 to the chiller (not illustrated) and returned. In one implementation, valve 110 includes a sensor (not illustrated) such that the sensor may provide the position of valve 110 to controller 104. If the position of valve is more open than closed, this indicates a higher load experienced by CDU 102 and as such, the differential pressure is decreased through a decrease in pump speed. In this implementation, it is assumed the other CDUs will monitor the respective valve position and increase the respective pump speed to increase coolant provided to the data center components. In this example of the valve position being more open than closed, this indicates that CDU 102 is experiencing a higher cooling load, thus the pump speed is decreased. Decreasing the pump speed also decreases the differential pressure such that lower flow of coolant is delivered to the data center cooling components. The operation assumes in response to one CDU is experiencing a higher cooling load, the CDU will decrease the coolant flow to the data center components while the other CDUs may increase their coolant flow to the data center components to balance the cooling system. If the position of valve 110 is more closed than open, this indicates CDU 102 is experiencing a lighter load, thus the pump speed is increased. Increasing the pump speed increases the differential pressure such that a greater flow of coolant is delivered to the data center components. This allows CDU 102 to contribute a higher flow of coolant among the multiple CDUs to balance the cooling system. Implementations of valve 110 include, by way of example, including a suction device, mechanical device, one-way valve, two-way valve, etc.

Pump 112 is a mechanical device adjusted by controller 104 in response to position of valve 110. Pump 112 controls the amount of coolant flow to the data center components. As such, the pump is used to maintain a differential pressure of coolant to the data center components prior to adjustment. The adjustment of the pump speed may include increasing or decreasing the speed based on the position of the valve 110 as explained in detail in later figures. As such, implementations of pump 112 include an engine, motor, a suction pump, or other type of variable pump that may increase or decrease speed to increase or decrease the differential pressure, accordingly.

Figure 2:
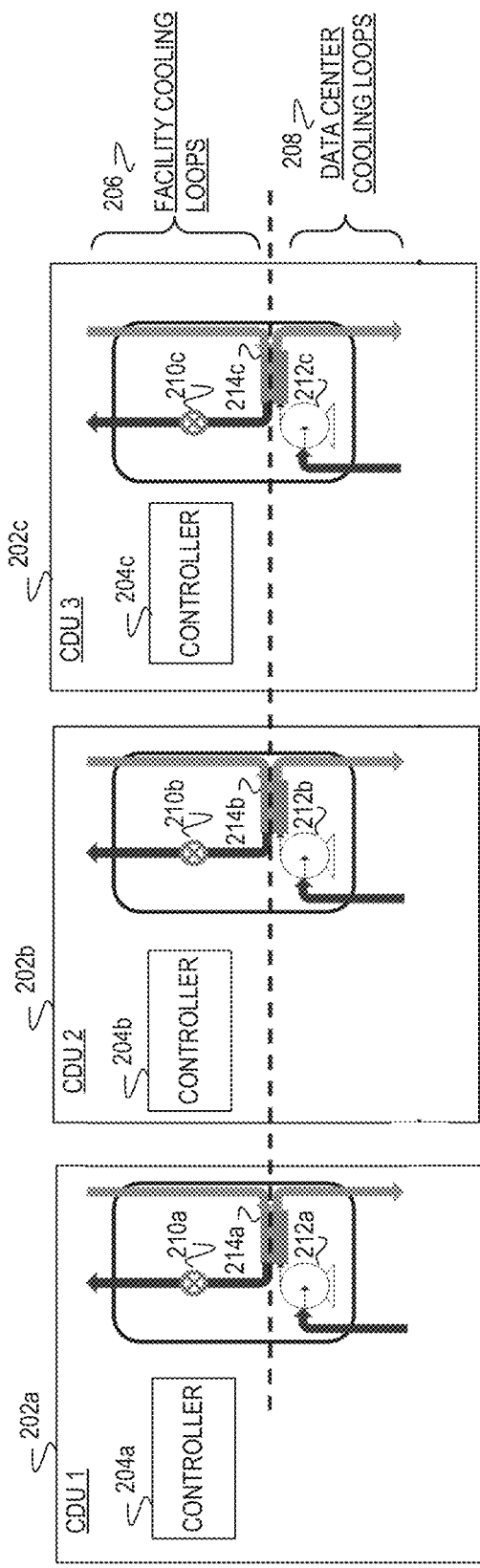
FIG. 2 illustrates an example cooling system including multiple CDUs with respective controllers to balance a cooling load to a data center via identification of a valve position and adjustment of a respective pump speed in accordance with the present disclosure.

FIG. 2 illustrates an example cooling system to balance a cooling load for a given data center. The cooling system includes first CDU 202a, second CDU 202b, and third CDU 202c. Each CDU 202a, 202b, 202c includes respective controller 204a-204c to identify a position of each respective valve 210a-210c. Based on the position of each valve 210a-210c, each respective controller 204a-204c adjusts a speed of respective pump 212a-212c. In addition to components 204a-204c, 210a-210c, and 212a-212c, each CDU 202a-202c operates respective heat exchanger 214a-214c. Respective heat exchanger 214a-214c receives chilled coolant on facility cooling loop 206 and transfers heat from return line on data center cooling loop 208.

In keeping with previous examples to balance the cooling system, assume first CDU 202a determines that the position of valve 210a is more open than closed. The position of valve 210a being more open than closed indicates to controller 214a that first CDU 202a is experiencing a higher cooling load. This means valve 210a is allowing a greater flow of coolant out and through the chiller and back through heat exchanger 214a. The greater flow of coolant means first CDU 202a is experiencing the higher load to cool data center cooling loop 208 via heat exchanger 214a. In response to identifying valve 210a is more open than closed, controller 214a decreases speed of pump 212a. Decreasing speed of pump 212a also causes a lower flow rate and thus the differential pressure to decrease. As such, it is assumed the other CDUs (i.e., second CDU 202b and third CDU 202c) will increase the speed of the respective pumps 212b and 212c to increase the flow of coolant to the data center components. The operation of balancing the cooling load occurs at each CDU 202a-202c without communication and/or intervention from other controllers and/or CDUs. This allows each CDU 202a-202c to operate independently of one another.

Figure 3:
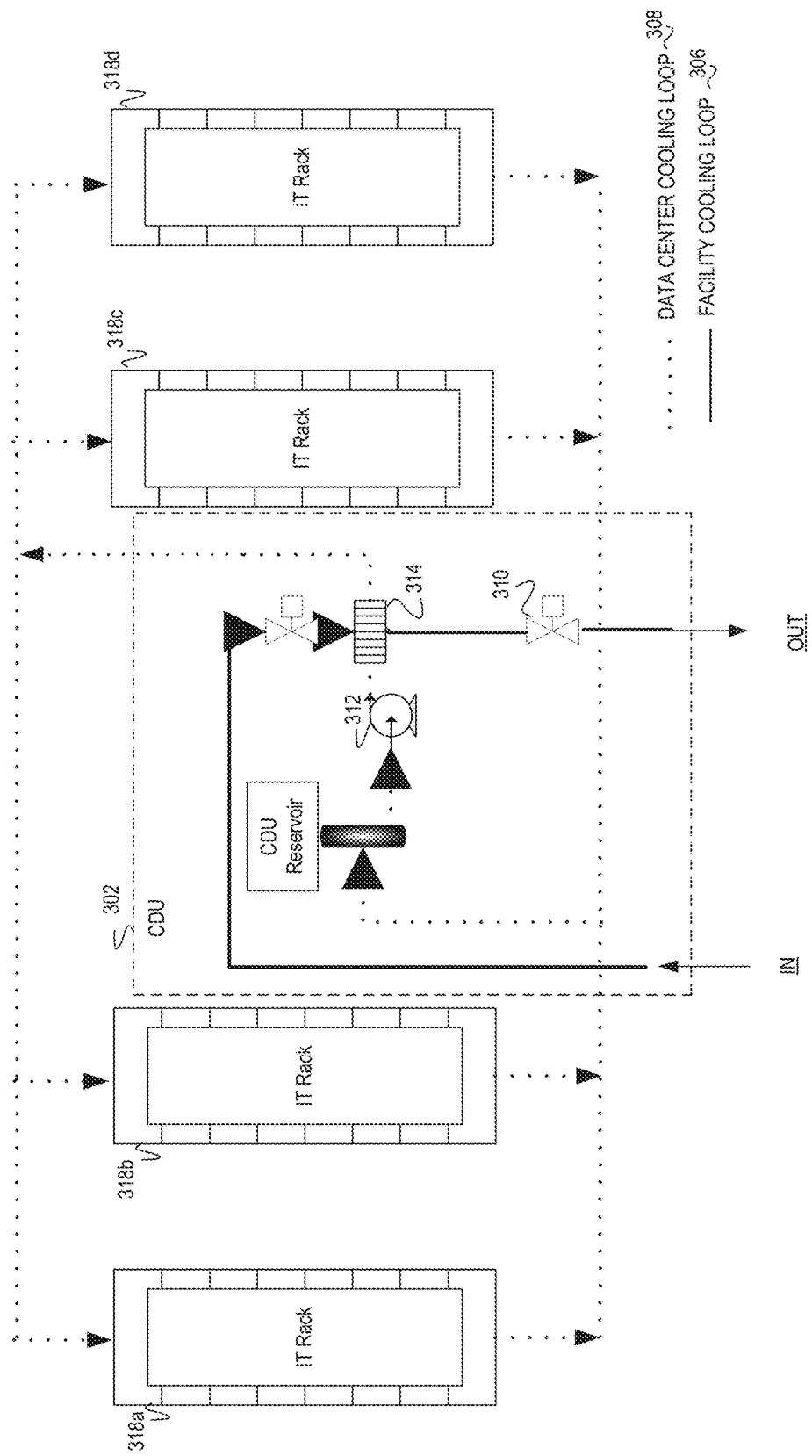
FIG. 3 illustrates an example cooling system including a CDU located in a data center to cool multiple racks in accordance with the present disclosure.

FIG. 3 illustrates an example cooling system which includes CDU 302 located at a row level to cool multiple racks 318a-318d in the data center. CDU 302 operates independently of other CDUs (not illustrated) to balance the cooling load to racks 318a-318d. CDU 302 identifies the position (e.g., how open or how closed) valve 310 is and in response, increases or decreases the speed of pump 312. As such in response to determining valve 310 is more closed than open, CDU 302 increases the pump speed 312 which increases the flow amount of coolant to the multiple racks 318a-318d and increases the pressure within the data center cooling loop 308. Thus in this example, the differential pressure is increased through the increase of pressure. CDU 302 increases the flow of coolant in response to determining the CDU is experiencing a lower cooling load. This indicates CDU 302 may increase its operating capabilities to contribute with other CDUs (not illustrated) to efficiently cool multiple racks 318a-318d.

Multiple racks 318a-318d receives coolant on a manifold through data center cooling loop 308. The coolant travels through each rack 318a-318d to cool the various components within each rack. The heated coolant exits on cooling loop and back to a CDU reservoir and heat exchanger 314. Heat exchanger 314 transfers the heat from the heated coolant to the chilled coolant on facility cooling loop 306.

Figure 4:
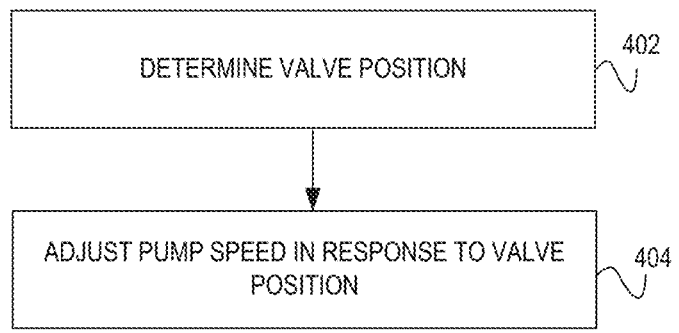
FIG. 4 illustrates an example flowchart executable by a CDU to cause an adjustment of a pump speed in response to determining a valve position in accordance with the present disclosure.

Referring now to FIGS. 4 and 5, flow diagrams are illustrated in accordance with various examples of the present disclosure. The flow diagrams represent processes that may be utilized in conjunction with various systems and devices as discussed with reference to the preceding figures. While illustrated in a particular order, the flow diagrams are not intended to be so limited. Rather, it is expressly contemplated that various processes may occur in different orders and/or simultaneously with other processes than those illustrated. As such, the sequence of operations described in connection with FIGS. 4-5 are examples and are not intended to be limiting. Additional or fewer operations or combinations of operations may be used or may vary without departing from the scope of the disclosed examples. Thus, the present disclosure merely sets forth possible examples of implementations, and many variations and modifications may be made to the described examples.

FIG. 4 is a flow diagram illustrates an example method adjusting pump speed in a CDU based on a valve position. The method may be initiated by determining the valve position. The valve position indicates how much of the load a particular CDU may be operating under. Thus, if the valve position is more open, this indicates the CDU is releasing more coolant to the facility for removing heat. If the valve is more closed, this indicates the CDU is releasing less coolant on the facility for heat removal. The various operations, processing blocks, and/or data flows depicted in FIG. 4 are described in greater detail herein. The described processing blocks may be accomplished using some or all of the system components described in detail above. For example in discussing FIG. 4, references may be made to the components in FIGS. 1-3 to provide contextual examples. In one implementation, controller 104 as in FIG. 1 executes operations 402-404 to adjust pump speed in response to the valve position. Although FIG. 4 is described as implemented by controller 104, it may be executable on other suitable hardware components. Accordingly, the method of FIG. 4 as illustrated (and described in greater detail below) is meant be an example and, as such, should not be viewed as limiting. For example, the method of FIG. 4 may be implemented in the form of executable instructions stored on a machine-readable storage medium and/or in the form of electronic circuitry.

At operation 402, the controller identifies the position of the valve. The valve controls a flow of the coolant from the CDU to a facility loop that removes heat from the coolant. The valve modulates to maintain the coolant to the CDU and in turn, the data center at a temperature set point. As such, the facility coolant loop operates in parallel with the data center component coolant loop. The position of the valve indicates how loaded the given CDU is. Alternatively, the valve position indicates an amount of cooling load undertaken for the given CDU. For example, if the valve is open 10%, then the CDU is considered lightly loaded. If the valve is open 75%, then this indicates the CDU is releasing more coolant and is carrying a higher cooling load. The more open the valve position indicates the greater amount of heat dissipation and thus the greater cooling load. Vice versa, the less open the valve position indicates a lesser amount of heat dissipation and lower cooling load. Through the identification of the valve position, the controller determines the cooling load placed on the given CDU. As such, the controller may proceed to make adjustments to decrease or increase the pump speed, accordingly as at operation 404. In an implementation, a valve is coupled to the facility coolant loop to communicate the valve position to the controller. In this implementation, the sensor may continue monitoring the valve position and provide to the controller, while in another implementation, the controller may monitor the valve position and/or request the valve position from the sensor.

At operation 404 in response to the determined valve position (e.g., valve more open or more closed), the controller adjusts the pump speed. The pump speed may increase, decrease, or maintain at a normal operational speed based on the valve position. The pump speed maintains the differential pressure of coolant flow to the data center components via flow control. As such, the differential pressure is directly proportional to the pump speed. For example, assume the valve position is more closed than open, the controller proceeds to increase the pump speed which in turn increases the flow rate of the coolant, and in turn the differential pressure, that is delivered to the data center components. In another example, assume the valve position is more open than closed, the controller proceeds to decrease the pump speed which in turn decreases the differential pressure. These implementations may be described in detail in a later figure.

FIG. 5 is a flow diagram illustrating a method of adjusting a pump speed in a CDU in response to the valve position. The method as illustrated in FIG. 5, is executable by a controller to exclusively control the CDU without interaction from any other CDUs. The controller determines an upper range valve position and a lower range valve position. This breaks up the valve position into segments such that if the valve position falls within one of those segments, the controller may proceed to adjust the pump speed, accordingly. Additionally, throughout the method, a heat exchanger operates to transfer the heat from the data center component coolant to the facility loop coolant. The various operations, processing blocks, and/or data flows depicted in FIG. 5 are described in greater detail herein. The described processing blocks may be accomplished using some or all of the system components described in detail above. For example in discussing FIG. 5, references may be made to the components in FIGS. 1-3 to provide contextual examples. In one implementation, controller 104 as in FIG. 1 executes operations 502-516 to adjust pump speed in response to the valve position. Although FIG. 5 is described as implemented by controller 104, it may be executable on other suitable hardware components. Accordingly, the method of FIG. 5 as illustrated (and described in greater detail below) is meant be an example and, as such, should not be viewed as limiting. For example, the method of FIG. 5 may be implemented in the form of executable instructions stored on a machine-readable storage medium and/or in the form of electronic circuitry.

At operation 502, the controller determines the upper range of valve positions and the lower range of valve positions. The lower range and upper range of valve positions includes the areas of position variation between being open to being closed. For example, the lower range may be defined as being 0% to 40% open, while an upper range of valve positions may include 60%-100% open. The range of positions includes both the lower range and upper range such that when the valve position falls within one of these ranges, the controller notifies the pump to respond accordingly. In keeping with the previous example, assume the valve position is located in the lower range limit of being open (e.g., being more closed than open), the controller increases the pump speed. This indicates that the CDU is able to meet the cooling load. Increasing the pump speed, also increases differential pressure. In another example, in response to the controller detecting the valve position in the upper range of being open (e.g., more open than closed). This indicates the CDU has a higher cooling load. This means the controller decreases pump speed such that the differential pressure also decreases as the flow amount to the data center components decreases. These implementations are detailed more throughout FIG. 5.

At operation 504, the heat exchanger operates in addition to performing the operations in FIG. 5. The heat exchanger is exclusive to the CDU, meaning the heat exchanger is not shared among other CDUs. The heat exchanger operates to transfer heat from the coolant on a return line from the data center components. The heat exchanger transfers heat to the coolant on the facility loop.

At operation 506, the controller identifies the valve position in the cooling system. As explained in earlier figures, the valve position indicates the amount of cooling load placed on the given CDU. The more open the valve position indicates a higher load meaning the valve is releasing more coolant for heat dissipation prior to returning to the heat exchanger. The more closed the valve position indicates a lower load on the CDU. Operation 506 may be similar in functionality to operation 402 as in FIG. 4.

At operation 508 in response to the valve position being located in a lower range indicates a lower load placed on the CDU. The lower load placed on the CDU means the pump speed is increased as at operation 516. In response to the controller determining the valve position not being located in the lower range, the controller proceeds to determine if the valve position is in an upper range as at operation 510. In response to the controller determining the valve position is located in one of the lower range positions, the controller increases the pump speed at operation 516.

At operation 510, the controller confirms the valve position is in one of the upper range of positions. In response to the confirmation that the valve position in one of the upper range of positions, this indicates the CDU is experiencing a higher cooling load, thus the pump speed is decreased at operation 512. Decreasing the pump speed also decreases the differential pressure such that lower flow of coolant is delivered to the data center cooling components. The operation assumes in response to one CDU is experiencing a higher cooling load, the CDU will decrease the coolant flow to the data center components while the other CDUs may increase their coolant flow to the data center components to balance the cooling system.

At operation 512 in response to the controller determining that the valve position is not located within one of the upper range positions, the controller maintains the pump speed. Determining that the valve position is not located in one of the upper range positions nor in one of the lower range positions, indicates the valve position is in a middle range and thus the pump speed is not increased nor decreased. As such, the pump speed is maintained at normal operation as at operation 514.

At operation 516 in response to the controller determining the valve position in one of the lower range of positions, the controller increases the pump speed. This means the given CDU has a lower cooling load, and as such to balance out the cooling system, the CDU increases the pump speed to increase the flow amount of coolant to the data center components. Increasing the pump speed, allows the given CDU to contribute more to the cooling system more increasing the coolant flow to the data center components.

Although certain embodiments have been illustrated and described herein, it will be greatly appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a variety of ways. This application is intended to cover adaptions or variations of the embodiments discussed herein. Therefore, it is manifestly intended that embodiments be limited only by the claims and equivalents thereof.

We claim:

1. A coolant distribution unit (CDU) comprising:
   a valve to control a flow of a facility coolant through the CDU;
   a pump to flow a data center coolant to data center components;
   a controller, exclusively controlling the CDU, to:
   determine a position of the valve; and
   based on the determined position of the valve, adjust a speed of the pump that maintains a differential pressure of the data center coolant flowing to the data center components, wherein the data center coolant transfers heat from the data center components to the facility coolant.

2. The coolant distribution unit (CDU) of claim 1 wherein the controller adjusts the speed of the pump based on the determined position of the valve comprises:
   in determination that the valve is more open than closed, decrease the speed of the pump such that the differential pressure of the data center coolant flowing to the data center components is decreased.

3. The coolant distribution unit of claim 2 wherein the controller adjusts the speed of the pump based on the determined position of the valve comprises:
   in determination that the valve is more closed than open, increase the speed of the pump such that the differential pressure of the data center coolant to the data center components is increased.

4. The coolant distribution unit of claim 3 wherein the controller adjusts the speed of the pump based on the determined position of the valve comprises:
   in determination that the valve is neither more closed than open nor more open than closed, adjust the speed of the pump to a normal operational speed such that the differential pressure of the data center coolant flowing to the data center components is maintained.

5. The coolant distribution unit (CDU) of claim 1 further comprising:
   a sensor, coupled to the valve, to provide the position of the valve to the controller.

6. The coolant distribution unit (CDU) of claim 1 comprising:
   a heat exchanger, exclusive to the CDU, to transfer the heat from the data center coolant on a return line from the data center components to the facility coolant.

7. The coolant distribution unit (CDU) of claim 1 wherein the controller operates independently of other CDUs to balance a cooling load across the data center components of a data center.

8. The coolant distribution unit (CDU) of claim 1 wherein the CDU is located at a row level to support multiple racks in a data center, the data center components including the multiple racks.

9. A system for cooling a data center comprising:
   a first coolant distribution unit (CDU), controlled exclusively by a first controller, the first CDU comprising:
   the first controller to:
   identify a position of a first valve controlling a flow of a facility coolant through the first CDU; and
   in response to the identified position of the first valve, adjust a speed of a first pump to maintain a differential pressure of a first data center coolant flowing to first data center components; and
   a second coolant distribution unit (CDU), controlled exclusively by a second controller, the second CDU comprising:
   the second controller to adjust a speed of a second pump to maintain a differential pressure of a second data center coolant flowing to second data center components, wherein the first data center coolant transfers heat from the first data center components to the facility coolant and the second data center coolant transfers heat from the second data center components to the facility coolant.

10. The cooling system of claim 9 wherein the first controller adjusts the speed of the first pump and the second controller adjusts the speed of the second pump absent communication from one another.

11. The cooling system of claim 9 wherein to adjust the speed of the second pump, the second controller is to:
    identify a position of a second valve; and
    in response to the identified position of the second valve, adjust the speed of the second pump.

12. The cooling system of claim 9 wherein in response to the identified position of the first valve, adjust the speed of the first pump, the first controller is to:
    in response to the identified position of the first valve in a lower range limit, increase the speed of the first pump such that the differential pressure of the first data center coolant flowing to the first data center components is increased;
    in response to the identified position of the first valve in an upper range limit, decrease the speed of the first pump such that the differential pressure of the first data center coolant flowing to data center components is decreased.

13. The cooling system of claim 9
    wherein the first CDU controlled exclusively by the first controller comprises a first sensor, coupled to the first valve, to provide the position of the first valve to the first controller; and
    wherein the second CDU controlled exclusively by the second controller comprises a second sensor, coupled to the second valve, to provide a position of the second valve to the second controller.

14. A method, operable by a coolant distribution unit (CDU) controlled exclusively by a controller, the method comprising:
    identifying, by the controller, a position of a valve that controls a flow of a facility coolant through the CDU; and
    adjusting, by the controller, a speed of the pump in response to the position of the valve such that a differential pressure of a data center coolant flowing to data center components is adjusted, wherein the data center coolant transfers heat from the data center components to the facility coolant.

15. The method of claim 14 wherein adjusting, by the controller, the speed of the pump in response to the position of the valve comprises:
  determining a lower range of the position of the valve; and
  in response to the position of the valve in the lower range limit, increasing the speed of the pump such that the differential pressure of the data center coolant increases.

16. The method of claim 15 wherein adjusting, by the controller, the speed of the pump in response to the position of the valve comprises:
  determining an upper range of the position of the valve; and
  in response to the position of the valve in the upper range limit, decreasing the speed of the pump such that the differential pressure of the data center coolant decreases.

17. The method of claim 14 wherein the controller adjusts the speed of the pump without contact from another controller.

18. The method of claim 14 further comprising:
  operating a heat exchanger, exclusive to the CDU, to transfer the heat from the data center coolant flowing on a return line from the data center components to the facility coolant.

19. The method claim 14 wherein the CDU operates to cool multiple servers within a data center, the multiple servers includes the data center components.

20. The method of claim 19 wherein the controller operates independently of other CDUs to balance a cooling load across the data center.

* * * * *